(12) United States Patent
Shiono

(10) Patent No.: US 7,323,050 B2
(45) Date of Patent: Jan. 29, 2008

(54) METHOD OF PRODUCING LITHIUM TANTALATE CRYSTAL

(75) Inventor: Yoshiyuki Shiono, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 59 days.

(21) Appl. No.: 10/548,098

(22) PCT Filed: Mar. 5, 2004

(86) PCT No.: PCT/JP2004/002853

§ 371 (c)(1),
(2), (4) Date: Sep. 6, 2005

(87) PCT Pub. No.: WO2004/079061

PCT Pub. Date: Sep. 16, 2004

(65) Prior Publication Data

US 2006/0169196 A1 Aug. 3, 2006

(30) Foreign Application Priority Data

Mar. 6, 2003 (JP) ............................. 2003-060603

(51) Int. Cl.
*C30B 25/12* (2006.01)

(52) U.S. Cl. .................. 117/86; 117/951; 117/952; 423/62

(58) Field of Classification Search .............. 117/2, 117/3, 951, 952, 86; 423/62, 119.5
See application file for complete search history.

(56) References Cited

U.S. PATENT DOCUMENTS

| 4,371,419 | A |   | 2/1983 | Fukuda et al. |
| 5,323,262 | A |   | 6/1994 | Mizuuchi et al. |
| 5,910,699 | A |   | 6/1999 | Namba et al. |
| 6,319,430 | B1 | * | 11/2001 | Bordui et al. ................ 252/584 |
| 6,348,094 | B1 | * | 2/2002 | Shiono et al. ................. 117/2 |
| 2005/0066879 | A1 |   | 3/2005 | Shiono |

FOREIGN PATENT DOCUMENTS

| EP | 0 893 515 A1 | 1/1999 |
| EP | 1 043 617 A1 | 10/2000 |
| JP | A 53-109900 | 9/1978 |
| JP | A 54-12587 | 1/1979 |
| JP | A 57-3800 | 1/1982 |
| JP | A 58-151399 | 9/1983 |
| JP | A 10-1391 | 1/1998 |
| JP | A 11-92147 | 4/1999 |
| WO | WO 01/33260 A1 | 5/2001 |
| WO | WO 2004/002891 A1 | 1/2004 |

* cited by examiner

*Primary Examiner*—Felisa Hiteshew
(74) *Attorney, Agent, or Firm*—Oliff & Berridge PLC

(57) ABSTRACT

A method of producing a lithium-tantalate crystal, wherein at least a first material containing lithium tantalate, lithium niobate or hydrogen storage alloy storing hydrogen that is subjected to a heat treatment at a temperature of T1' that is Curie temperature or higher in a reducing atmosphere is superposed on a single-polarized lithium-tantalate crystal, and then the crystal is subjected to a heat treatment at a temperature of T2' that is lower than Curie temperature in a reducing atmosphere, thereby an electric conductivity of the single-polarized lithium-tantalate crystal is increased. There can be provided a method of producing a lithium-tantalate crystal wherein the surface charge generated by applying a temperature change to the lithium-tantalate crystal can be decayed quickly without accumulating by increasing the electric conductivity, and an effective piezoelectric property is exhibited by maintaining the single polarized structure.

51 Claims, No Drawings

METHOD OF PRODUCING LITHIUM TANTALATE CRYSTAL

This application is a 371 of PCT/JP04/02853 Mar. 5, 2004.

TECHNICAL FIELD

The present invention relates to a method of producing a lithium-tantalate crystal which is used for the application wherein a pattern is formed with a metal electrode on a wafer to process an electrical signal such as a surface acoustic wave device.

DESCRIPTION OF THE RELATED ART

Lithium tantalate is used for the application which utilizes its electrical properties, such as a SAW device which performs a signal processing using a surface acoustic wave (SAW). The lithium-tantalate crystal suitable for this purpose shows a piezoelectric response (piezoelectric property) originated from the crystal structure thereof and needed for a SAW device. However, the lithium-tantalate crystal obtained by a general method has a pyroelectric response (pyroelectric property), in addition to the piezoelectric property.

A piezoelectric property of a lithium-tantalate crystal is essential characteristic when using the lithium-tantalate crystal as a SAW device. On the other hand, a pyroelectric property is observed as a surface charge generated on an external surface of a lithium-tantalate crystal by applying a temperature change to the crystal, and charges the crystal with electricity. It is considered that, when using a lithium-tantalate crystal as a SAW device, the surface charge causes a spark discharge between metal electrodes formed on the wafer consisting of a lithium-tantalate crystal, which causes a significant defect in a performance of the SAW device. For this reason, in a design of a SAW device using a lithium-tantalate crystal, there are needed an artifice for preventing the generation of a surface charge, an artifice for discharging the surface charge, an artifice for making an interval between metal electrodes large, or the like. There is the disadvantage that the design of the SAW device itself is restricted in order to take these artifices in the design.

Moreover, in the process of producing a SAW device using a lithium-tantalate crystal, there is a process of heating the lithium-tantalate crystal in processes such as deposition of a metal film and removal of a resist. If a temperature change such as elevation or lowering of temperature is applied to the lithium-tantalate crystal in these processes, a charge will be generated on the external surface due to the pyroelectric property of the lithium-tantalate crystal. As mentioned above, a spark discharge may be generated between metal electrodes due to this surface charge, and cause the breakage of the electrode pattern. Therefore, artifices are considered so that a temperature change may not be applied as possible, or so that a temperature change may be gentle in the process of producing the SAW device. These artifices may cause disadvantages that the throughput of the production process is lowered, and that the margin which guarantees the performance of the SAW device becomes narrow.

Although the charge on the external surface generated due to the pyroelectric property is neutralized by the free charge from the surrounding environment and decayed with time in the lithium-tantalate crystal produced by the usual method, the decay time is long as several hours or more, and thus it is not industrial to decay the generated surface charge by such natural neutralization in the process of producing the SAW device.

From the above-mentioned background, there has been increased a demand for the piezoelectric crystal in which the generation or accumulation of the charge is not observed on the external surface of the crystal with maintaining the piezoelectric property needed, in order to achieve device characteristics for the application like a SAW device, and there has been needed a lithium-tantalate crystal in which the accumulation of the surface charge is not observed for such an application.

In order to prevent the accumulation of the surface charge, it was considered to increase the electric conductivity of a lithium-tantalate crystal. As a method for producing a lithium-tantalate crystal in which the electric conductivity is increased, for example, in Japanese Patent Application Laid-open (Kokai) No.11-92147, there is disclosed a method wherein a lithium-tantalate crystal is exposed to a reducing atmosphere at 500° C. or higher. However, if the lithium-tantalate crystal is reduced according to the method as described above, the single polarized structure needed for the application to the SAW device is lost in the case that the treatment temperature in a reducing atmosphere is 610° C., which is the Curie temperature of lithium tantalate, or higher. In the case that the treatment temperature in a reducing atmosphere is 610° C. or less, a reaction rate of the reduction treatment becomes extremely slow. As a result, it was found that by using the method the electric conductivity of a lithium-tantalate crystal cannot be increased industrially.

DISCLOSURE OF THE INVENTION

The present invention provides a method to solve the above-mentioned problems and the present invention provides a method of producing a lithium-tantalate crystal in which the surface charge generated by applying a temperature change to the lithium-tantalate crystal can be decayed without accumulating by increasing the electric conductivity of the lithium-tantalate crystal, and an effective piezoelectric property is exhibited by maintaining the single polarized structure.

To solve the above-mentioned problems, the present invention provides a method of producing a lithium-tantalate crystal with increased electric conductivity, wherein a substance reduced at a temperature of T1 is contacted with a lithium-tantalate crystal at a temperature of T2 that is lower than the temperature of T1 in a reducing atmosphere. According to the method, by reducing a lithium-tantalate crystal using a reduced substance, the electric conductivity of the lithium-tantalate crystal can be made high at relatively lower temperature. As a result, pyroelectric charge generated by applying a temperature change to the lithium-tantalate crystal can be reduced.

Moreover, it is preferable that the temperature of T1 is 700° C. or higher. Thereby, the reduction treatment of the substance can be quickly conducted.

In addition, it is preferable that the reduction at the temperature of T1 is performed in a reducing gas containing any one of hydrogen, carbon monoxide and nitrous oxide, or a mixed gas consisting of two or more of them. When performing the reduction like this, the reduced substance can be obtained by using generally known reducing gases. It is especially preferable to use hydrogen or carbon monoxide as the reducing gas because the reduction treatment can be quickly conducted.

Furthermore, the reduction is also preferably performed in an atmosphere in which any one of He, Ne, Ar, other rare gases, nitrogen, and carbon dioxide, or a mixed gas consisting of two or more of them is added further to the reducing gas. By performing the reduction like this, a rate of the reduction and a treatment time for the reduction can be controlled.

In addition, the reducing gas atmosphere is preferable that can treat a target substance for the reduction treatment as quickly as possible.

Furthermore, in the present invention, a crystal, a ceramic, a metal and preferably a hydrogen storage alloy can be used as the substance reduced at the temperature of T1. As mentioned above, if a substance that can reduce a lithium-tantalate crystal at the temperature of T2 is used as the substance reduced at the temperature of T1, a lithium tantalate with increased electric conductivity can be produced.

In addition, in the present invention, the crystal or the ceramic which consists of mixed oxide with nonstoichiometric composition can be used. By using this, a substance reduced effectively at the temperature of T1 can be obtained. This is because nonstoichiometric composition has lack of cations and it is considered that the lack is closely related to the reduction treatment.

Instead of using the stoichiometric composition having a little lack of cations, if a composition that doesn't have a composition ratio according to stoichiometry such as congruent composition is used, high reducing property can be achieved because of a lot of lack of cations.

Furthermore, a lithium tantalate or a lithium niobate can be used as the crystal or the ceramic. It is preferable to use these because they are conventionally used as a material for the SAW device, they don't contaminate a lithium-tantalate crystal to be a product and they have sufficient reducing property.

In addition, in the present invention, a single-polarized crystal can be used as the lithium-tantalate crystal contacted at the temperature of T2 with the substance reduced at the temperature of T1. It is preferable to use this because the lithium-tantalate crystal obtained according to the present invention isn't necessary to be subjected to a single polarization process after the reduction treatment at the temperature of T2.

A conventional single polarization process is conducted at a high temperature of Curie temperature of lithium tantalate (about 610° C.) or higher and by applying a voltage in an atmosphere. However, when a lithium-tantalate crystal in which electric conductivity is increased by a reduction treatment or the like is made to a temperature of 400° C. or higher in an atmosphere, the increased electric conductivity is lowered. As a result, there is a problem that even if a lithium-tantalate crystal is subjected to a reduction treatment to increase its electric conductivity, the electric conductivity reverts to the value before the reduction treatment by conducting a following single polarization process at Curie temperature or higher.

Therefore, in the present invention, it is preferable that the temperature of T2 in which a lithium-tantalate crystal and a reduced substance are contacted with each other is 400° C.-600° C. As described above, if T2 is lower temperature than the Curie temperature of a lithium-tantalate crystal, a single-polarized lithium-tantalate crystal can maintain the single polarized structure, and because the contact is conducted in a reducing atmosphere, there is no problem that the electric conductivity is lowered.

In addition, it is preferable that after the process at the temperature of T2, an atmosphere is introduced at a temperature of 250° C. or less. As mentioned above, by being exposed to an atmosphere at a temperature of 250° C. or less, there is no possibility that electric conductivity of the lithium-tantalate crystal increased by the treatment at the temperature of T2 is lowered by being exposed to the atmosphere.

Furthermore, a crystal that is in a step before slicing can be used as the single-polarized crystal, and a wafer subjected to a slicing process or a wafer subjected to a lapping process can be used as the single-polarized crystal. Especially, when a sliced wafer or a lapped wafer is used, a surface area compared to a volume becomes larger and so a contact area with the reduced substance can be increased, thus the electric conductivity can be increased effectively.

In addition, in the present invention, it is preferable that the reduction at the temperature of T2 is performed in a reducing gas consisting of any one of hydrogen, carbon monoxide and nitrous oxide, or a mixed gas consisting of them. Thereby, a reduction treatment is conducted in a generally known reducing gas and a lithium-tantalate crystal with increased electric conductivity can be obtained. It is especially preferable to use hydrogen or carbon monoxide as the reducing gas because the reduction treatment can be quickly conducted.

Furthermore, the reduction at the temperature of T2 is performed in an atmosphere in which an inert gas consisting of He, Ne, Ar, other rare gases, nitrogen, and carbon dioxide, or a mixed gas consisting of them is added further to the reducing gas consisting of any one of hydrogen, carbon monoxide and nitrous oxide, or a mixed gas consisting of them. By performing the reduction like this, a rate of the reduction and a treatment time for the reduction can be controlled.

The present invention also provides a method of producing a lithium-tantalate crystal, wherein at least a first material containing lithium tantalate, lithium niobate or hydrogen storage alloy storing hydrogen that is subjected to a heat treatment at a temperature of T1' that is Curie temperature or higher in a reducing atmosphere is superposed on a single-polarized lithium-tantalate crystal, and then the crystal is subjected to a heat treatment at a temperature of T2' that is lower than Curie temperature in a reducing atmosphere, thereby an electric conductivity of the single-polarized lithium-tantalate crystal is increased.

According to the method, because the first material has reducing property, by superposing the first material on the single-polarized lithium-tantalate crystal and subjecting them to a heat treatment at a temperature of T2' that is lower than Curie temperature in a reducing atmosphere, a single-polarized lithium-tantalate crystal can be reduced effectively even if the temperature is not Curie temperature or higher. Accordingly, the electric conductivity of a lithium-tantalate crystal can be effectively increased with the crystal being single-polarized.

In addition, it is preferable that the lithium-tantalate crystal obtained by the heat treatment at the temperature of T2' is subjected to a heat treatment at a temperature of T3 that is lower than Curie temperature in an atmosphere, the lithium-tantalate crystal is superposed on a second material containing lithium tantalate, lithium niobate or hydrogen storage alloy storing hydrogen that is subjected to a heat treatment at a temperature of T1" that is Curie temperature or higher in a reducing atmosphere, and the crystal is subjected to a heat treatment at a temperature of T2" that is lower than Curie temperature in a reducing atmosphere, thereby an electric conductivity of the lithium-tantalate crystal is increased.

When a single-polarized lithium-tantalate crystal in which the electric conductivity is increased by the reduction according to the above-mentioned method is once subjected to a heat treatment at a temperature of T3 that is lower than Curie temperature in an atmosphere, and then the crystal is superposed on a second material having reducing property and subjected to a heat treatment at a temperature of T2" that is lower than Curie temperature in a reducing atmosphere, it is sure that the electric conductivity of the lithium-tantalate crystal can be increased more uniformly.

In addition, it is preferable that the lithium-tantalate crystal obtained by the heat treatment at the temperature of T2' is subjected to a heat treatment at a temperature of T3 that is lower than Curie temperature in an atmosphere, the lithium-tantalate crystal is subjected to a heat treatment at a temperature of T2''' that is lower than Curie temperature in a reducing atmosphere, thereby an electric conductivity of the lithium-tantalate crystal is increased.

As mentioned above, when a single-polarized lithium-tantalate crystal in which the electric conductivity is increased by the reduction according to the above-mentioned method is once subjected to a heat treatment at a temperature of T3 that is lower than Curie temperature in an atmosphere, and then without using the second material the crystal is subjected to a heat treatment at a temperature of T2''' that is lower than Curie temperature in a reducing atmosphere, it is sure that the electric conductivity of the lithium-tantalate crystal can be increased.

In this case, it is preferable that the temperatures of T2', T2", T2''' that are lower than Curie temperature are 400° C. or higher. Thereby, the electric conductivity of a lithium-tantalate crystal can be effectively increased.

In addition, it is preferable that a wafer subjected to a slicing process or a wafer subjected to a lapping process is used as the single-polarized lithium-tantalate crystal. When using this, since a surface area compared to a volume becomes larger and a contact area with the first or the second material or an area that is exposed to a reducing atmosphere can be larger, the electric conductivity of a lithium-tantalate crystal can be effectively and uniformly increased.

Furthermore, it is preferable that a ceramic or a crystal consisting of lithium tantalate or lithium niobate is used as the first material or the second material. As described above, either a ceramic or a crystal of lithium tantalate or lithium niobate can be used as the first material or the second material. Such a material doesn't cause harmful effect such as contamination or others when it is superposed on the lithium-tantalate crystal and subjected to a heat treatment.

In addition, it is preferable that a composition that doesn't have a composition ratio according to stoichiometry is used as the ceramic or the crystal consisting of lithium tantalate or lithium niobate. When using this, because the first or the second material has much lack of cations and reducing property becomes high, the electric conductivity of a lithium-tantalate crystal can be effectively and uniformly increased.

Furthermore, it is preferable that a wafer subjected to a slicing process that is obtained from a crystal consisting of lithium tantalate or lithium niobate, or a wafer subjected to a lapping process that is obtained from a crystal consisting of lithium tantalate or lithium niobate is used as the first material or the second material. When using this, because a surface area compared to a volume becomes larger and an area that is exposed to a reducing atmosphere can be larger, the material effectively reduced can be obtained. In addition, because such a material is easy to be superposed on a single-polarized lithium-tantalate crystal, the electric conductivity of a lithium-tantalate crystal can be effectively increased.

In addition, it is preferable that after the heat treatment at the temperature of T2', T2" and T2''', the lithium-tantalate crystal is exposed to an atmosphere at a temperature of 250° C. or less. Thereby, there is no possibility that the electric conductivity of a single-polarized lithium-tantalate crystal increased by the heat treatment at the temperature of T2', T2" and T2''' is lowered by being exposed to an atmosphere.

Furthermore, it is preferable that the reducing atmosphere for the heat treatment at the temperature of T1', T1", T2', T2" and T2''' contains a reducing gas consisting of at least any one of hydrogen, carbon monoxide and nitrous oxide. As mentioned above, any one of these conventionally known reducing atmospheres can be used as a reducing atmosphere of the heat treatment conducted at either temperature.

Moreover, it is preferable that an additional gas consisting of at least any one of rare gases, nitrogen, and carbon dioxide is added further to the reducing gas. By doing as mentioned above, a rate of the reduction and a treatment time for the reduction can be controlled.

As explained above, according to the present invention, a lithium-tantalate crystal in which accumulation of the surface charge generated by a temperature change due to pyroelectric property is not substantially observed, especially a single-polarized lithium-tantalate crystal can be produced because electric conductivity of the crystal is increased. Accordingly, a lithium-tantalate crystal in which accumulation of the charge is not observed on the external surface of the crystal with maintaining the piezoelectric property thereof, and thus it is very advantageous for the production of the SAW device can be produced. Furthermore, the method of the present invention is industrially advantageous because the above lithium-tantalate crystals can be produced effectively by a quite short-time process.

BEST MODE FOR CARRYING OUT THE INVENTION

The present invention will be further described below in detail.

As described above, there is disclosed a method that a lithium-tantalate crystal is exposed to a reducing atmosphere at 500° C. or higher as a conventional method of producing a lithium-tantalate crystal with increased electric conductivity.

However, when a lithium-tantalate crystal is reduced according to such a method, there is a problem that the single-polarized structure needed for a SAW device application is lost if treatment temperature in a reducing atmosphere is 610° C. which is the Curie temperature of lithium tantalate or higher, and that the reaction rate of the reduction treatment becomes very slow if the temperature is 610° C. or less, and therefore it isn't industrial.

The inventor of the present invention has found that when a first material with reducing property containing lithium tantalate, lithium niobate or hydrogen storage alloy storing hydrogen that is reduced effectively at a temperature that is Curie temperature or higher in a reducing atmosphere is superposed on a single-polarized lithium-tantalate crystal, and then the crystal is subjected to a heat treatment in a reducing atmosphere, the first material reduces the lithium-tantalate crystal via the interface, thereby the reduction treatment can be effectively conducted even at a temperature lower than Curie temperature, electric conductivity can be increased and the single polarized structure can also be maintained. In this case, it is considered that the reduction treatment activates the single-polarized lithium-tantalate crystal to a reduction reaction.

Moreover, the inventor of the present invention has found that when the lithium-tantalate crystal activated to the reduction reaction is subjected to a heat treatment at a temperature that is lower than Curie temperature in an atmosphere, electric conductivity is once decreased (resistivity is increased) but the activated state is maintained, therefore the crystal superposed on a second material with reducing property or the crystal alone is subjected to a heat treatment at a temperature that is lower than Curie temperature in a reducing atmosphere, thereby electric conductivity can be further increased (resistivity can be further decreased). And then the inventor completed the present invention.

The embodiments of the present invention will be specifically explained below, but the present invention is not limited thereto.

As an example of a substance to be reduced at a temperature of T1, a first material or a second material that is used in the present invention (hereinafter occasionally referred to as materials), there is a ceramic consisting of lithium tantalate. This can be obtained by weighing and mixing lithium carbonate and tantalum pentoxide, and heating them at 1000° C. or higher in an electric furnace. A ceramic consisting of lithium niobate can be used since it is obtained by using niobium pentoxide instead of tantalum pentoxide.

The ceramic obtained above is put into a stainless steel container or a container made of quartz. The container is placed in a sealed furnace. A reducing gas is flowed at a rate of approximately 1.5 liters per minute through the sealed furnace. A temperature of the furnace is increased from room temperature to a temperature of T1, or a temperature of T1' or T1'' that is Curie temperature or higher like 700° C.-1200° C. After maintaining the temperature for 1-50 hours, the temperature of the furnace is decreased at a rate of around 6.7° C. per minute and the container is removed from the furnace. Materials are thus obtained. A reducing atmosphere including a reducing gas consisting of at least any one of generally known reducing gases of hydrogen ($H_2$), carbon monoxide (CO) and nitrous oxide can be used. In addition, it is preferable that an additional gas consisting of at least any one of He, Ne, Ar, other rare gases, nitrogen ($N_2$), and carbon dioxide ($CO_2$) is added further to the reducing gas because a rate of the reduction and a treatment time for the reduction can be controlled. A reducing atmosphere explained above can be used as either reducing atmosphere explained hereinafter.

It is preferable that the ceramic consisting of lithium tantalate or other mixed oxide with nonstoichiometric composition is used because it has lack of cations and so it has high reducing property. It is preferable to use a composition that doesn't have a composition ratio according to stoichiometry, for example, lithium tantalate in which a composition ratio of lithium and tantalum is not 50:50, because it has a lot of lack of cations.

In addition, there is a lithium-tantalate crystal as an example of materials used in the present invention. This can be grown by putting the ceramic consisting of lithium tantalate before being subjected to reduction treatment into a crucible made of noble metals, heating and melting the ceramic, and then pulling a crystal using a seed crystal with being rotated (so-called Czochralski method). Furthermore, a lithium-niobate crystal can be grown according to the same method. Although a method to reduce thus-obtained lithium-tantalate crystal is the same as that for the above-mentioned ceramic, it is preferable that an atmosphere is introduced into the furnace at a temperature of 250° C. or less during lowering temperature after the heat treatment, and that the crystal is removed from the furnace when the temperature becomes 30° C. or less. It is not preferable to introduce an atmosphere at a temperature higher than 250° C. because there-is a possibility that the lithium-tantalate crystal is oxidized. It is also preferable to use a composition that has nonstoichiometric composition and that doesn't have a composition ratio according to stoichiometry as the crystal, as is the case with the ceramic.

There is a sliced wafer or a lapped wafer consisting of a lithium-tantalate crystal as an example of materials used in the present invention. For example; above-mentioned lithium-tantalate crystal, for example, having a diameter of 100 mm is sliced, for example, by a wire saw, thereby a wafer subjected to a slicing process having a diameter of 100 mm and a thickness of 0.5 mm is obtained. Furthermore, by processing this wafer using a lap machine, a-wafer subjected to a lapping process having a diameter of 100 mm and a thickness of 0.4 mm is obtained. A polished wafer obtained by polishing one side or both sides of the lapped wafer can also be used. A method to reduce thus-obtained wafer is the same as that for the above-mentioned crystal. The crystal orientation of the wafer can be selected according to the characteristics to be required, for example, a wafer oriented with the surface normal to the 36° rotated y-direction can be used.

By the reduction treatment, color of a lithium-tantalate crystal or a lithium-tantalate wafer as materials changes from white before treatment to black and the crystal or the wafer gains absorptive power. However, because the temperature of T1, T1' and T1'' are not less than the Curie temperature of a lithium-tantalate crystal, a lithium-tantalate crystal or a lithium-tantalate wafer obtained by this treatment has a multi-domain structure unsuitable for the SAW device.

In addition, other than those described above, other reduced crystals, a ceramic, a hydrogen occluded metal like palladium, preferably a hydrogen storage alloy in which niobium (Nb), manganese (Mn) and the like are mixed with a basic element such as $LaNi_5$, FeTi or $Mg_2Ni$ are also used as the materials in the present invention.

Next, a lithium-tantalate crystal or a lithium-tantalate wafer of which electric conductivity is finally increased in the present invention can be prepared by the same way as the lithium-tantalate crystal or the lithium-tantalate wafer to be the materials. That is by growing a crystal by Czochralski method or slicing process and lapping process for the grown crystal. In order to single-polarize these, a noble metal electrode is set on the lithium-tantalate crystal, then a voltage is applied at a temperature of not lower than the Curie temperature of lithium tantalate, for example at 650° C. Thereby, a single polarization process is conducted. Furthermore, by subjecting this single-polarized crystal to slicing process or lapping process, a single-polarized sliced wafer or lapped wafer is obtained. A polished wafer obtained by polishing one side or both sides of the lapped wafer can also be used.

Next, the lithium-tantalate crystal that is subjected to the single polarization process as mentioned above is superposed on a substance reduced at a temperature of T1 or a first material to contact with it. The crystals and the substances or the first materials are piled alternately and placed in a furnace through which, for example, a reducing gas is flowed at a rate of approximately 1.5 liters per minute. A temperature of the furnace is increased from room temperature at a rate of around 6.7° C. per minute. After maintaining the temperature at a temperature of T2 lower than T1 or a temperature of T2' lower than the Curie temperature, for example from 400° C.-600° C. for 1-50 hours, the temperature of the furnace is decreased at a rate of around 6.7° C. per minute. An atmosphere is introduced into the furnace at a temperature of 250° C. or less, and the crystal is removed from the furnace when the temperature becomes 30° C. or less.

As described above, according to the present invention, a lithium-tantalate crystal with single-polarized structure and with increased electric conductivity can be obtained. Moreover, according to the present invention, in order to surely obtain a lithium-tantalate crystal with the further increased electric conductivity, either following two methods can be conducted in addition to the above-mentioned methods.

The first method is explained as follows. First, a lithium-tantalate crystal with single-polarized structure and with increased electric conductivity is placed in a furnace in which an atmosphere is introduced. A temperature of the furnace is increased from room temperature at a rate of around 6.7° C. per minute. After maintaining the temperature at a temperature of T3 that is lower than Curie temperature, for example, 400° C.-600° C. for 1-50 hours in the atmosphere, the temperature of the furnace is lowered at a rate of around 6.7° C. per minute, and the crystal is removed from the furnace when the temperature becomes 30° C. or less. By conducting such a heat treatment, the lithium-tantalate crystal becomes white and its electric conductivity once decreases and its resistivity increases. However, activated state to a reduction reaction in the crystal is maintained and the single polarized structure is also maintained.

Next, the white lithium-tantalate crystal subjected to the heat treatment in the atmosphere as mentioned above is superposed on the second material obtained by being subjected to the heat treatment at the temperature of T1" as mentioned above, for example, a wafer of the blackly colored lithium-tantalate crystal to contact with it. The crystal and the second material are piled alternately and placed in a furnace through which a reducing gas is flowed at a rate of approximately 1.5 liters per minute. A temperature of the furnace is increased from room temperature at a rate of around 6.7° C. per minute. After maintaining the temperature at a temperature of T2" lower than the Curie temperature, preferably at 400° C.-600° C. for 1-50 hours, the temperature of the furnace is decreased at a rate of around 6.7° C. per minute. An atmosphere is introduced into the furnace at a temperature of 250° C. or less, and the crystal is removed from the furnace when the temperature becomes 30° C. or less. By such a heat treatment, a single-polarized lithium-tantalate crystal in which electric conductivity is further uniformly increased is surely obtained. Particularly, although the black lithium-tantalate crystal obtained by one time of reduction treatment is prone to be colored unevenly, by being subjected to two times of reduction, the uniform black lithium-tantalate crystal without unevenness of color corresponding to variation of electric conductivity can be surely obtained.

On the other hand, the second method is explained as follows. Activated state to a reduction reaction is maintained in the white lithium-tantalate crystal subjected to the heat treatment in an atmosphere. Accordingly, the following heat treatment can be conducted: without using the second material, the crystal is placed alone in a furnace. A reducing gas is flowed at a rate of approximately 1.5 liters per minute. A temperature of the furnace is increased from room temperature at a rate of around 6.7° C. per minute. After maintaining the temperature at a temperature of T2''' lower than the Curie temperature, preferably at 400° C.-600° C. for 1-50 hours, the temperature of the furnace is decreased at a rate of around 6.7° C. per minute. An atmosphere is introduced into the furnace at a temperature of 250° C. or less, and the crystal is removed from the furnace when the temperature becomes 30° C. or less. By such a heat treatment, the single-polarized black lithium-tantalate crystal in which electric conductivity is further uniformly increased and there is no unevenness of color corresponding to variation of electric conductivity can also be surely obtained.

The electric conductivity of the single-polarized lithium-tantalate crystal with increased electric conductivity obtained by the present invention can be measured as follows. That is, the electric conductivity is a reciprocal of a volume resistivity, and the volume resistivity can be obtained from a resistance measured by using 4329A High Resistance Meter and 16008A Resistivity Cell manufactured by Hewlett Packard, according to the following formula.

$$\rho = (\pi d^2/4t) \cdot R$$

$\rho$: Volume resistivity ($\Omega \cdot cm$)

$\pi$: the ratio of the circumference to its diameter d: Diameter of center electrode (cm)

t: Thickness of a lithium-tantalate crystal or a lithium-tantalate wafer (cm)

R: Resistance ($\Omega$)

In measurement, the voltage of, for example 500 V may be applied to a wafer, and the resistance may be measured one minute after the application of voltage in order to obtain a stable measurement value.

In addition, effect of the present invention is also confirmed by measuring surface potential of a wafer. Surface potential is a quantity of electric charge accumulated on the surface by temperature difference due to pyroelectric property. This is known as measurement of surface potential that is the same quantitative measurement as measurement of static electricity. While a temperature of a lithium-tantalate wafer with increased electric conductivity is increased from 30° C.-70° C. in 1 minute on a hot plate, change of surface potential during that time is measured, for example, by using SFM775 manufactured by Ion Systems, surface potential is thus obtained.

Hereinafter, the present invention will be explained in detail in reference to examples and comparative examples, however, the present invention is not limited thereto.

A lithium-tantalate (LT) wafer to be used in examples and comparative examples was produced as follows. A lithium-tantalate crystal oriented with the surface normal to the 36 rotated y-direction and having a diameter of 100 mm and a length of 50 mm was obtained by using Czochralski method and commonly used secondary processing method (hereinafter referred to as an LT crystal). A platinum electrode was set on the LT crystal, a voltage was applied at 650° C. and a single polarization process was conducted. Next, this LT crystal was subjected to a slicing process and a lapping process, and double-sided lapped wafers having a thickness of 0.4 mm were obtained (hereinafter these wafers are referred to as LT lapped wafers). One side of these LT lapped wafers was polished and wafers having a thickness of 0.35 mm were obtained (hereinafter these wafers are referred to as LT polished wafers). These wafers were colorless and translucent.

EXAMPLES 1-18

The LT lapped wafers thus obtained were placed in a sealed furnace through which a reducing gas shown in Table 1 was flowed at a rate of approximately 1.5 liters per minute. This furnace comprised a three-zone tube furnace with a horizontal, 200 mm-diameter alumina process tube. The wafers were supported by alumina carriers placed in the center of the process tube. The alumina process tube extended out of the furnace so that its ends were exposed and remained cool. O-ring seals on the alumina process tube provided a sealed furnace cavity. The wafer was loaded into the process tube, which was then sealed with end caps. The gas flow was initiated and the furnace heating begun. The temperature of the furnace was increased from room temperature to the temperature of T1 shown in Table 1 at a rate of about 6.7° C. per minute. Then, the temperature of T1 was maintained for 1 hour, the furnace was cooled down at a rate of about 6.7° C. per minute. An atmosphere was introduced into the furnace when the temperature reached 250° C. or less, and the wafer is removed from the furnace when the temperature reached 30° C. or less (hereinafter this wafer is referred to as a T1-processed LT wafer). Next, an LT lapped wafer subjected to a single polarization process and the T1-processed LT wafer were piled alternately to be contacted with each other, and the wafers were placed in a sealed furnace through which a hydrogen gas was flowed at rate of approximately 1.5 liters per minute. This furnace is the same as that used in the reduction treatment at the temperature of T1. The temperature of the furnace was increased from room temperature at a rate of about 6.7° C. per minute. After the furnace was maintained at the temperature of T2 shown in Table 1 for 1 hour, the furnace was cooled down at a rate of about 6.7° C. per minute. An atmosphere was introduced into the furnace when the temperature reached 250° C. or less, and the wafer was removed from the furnace when the temperature reached 30° C. or less (hereinafter this wafer is referred to as a T2-processed LT wafer).

The electric conductivity of the T2-processed LT wafer was obtained as follows. The electric conductivity is a reciprocal of a volume resistivity, so at first the volume resistivity was obtained from a resistance measured by 4329A High Resistance Meter and 16008A Resistivity Cell manufactured by Hewlett Packard according to the following formula.

$$\rho=(\pi d^2/4t)\cdot R$$

ρ: Volume resistivity (Ω·cm)
π: the ratio of the circumference to its diameter
d: Diameter of center electrode (cm)
t: Thickness of T2-processed LT wafer (cm)
R: Resistance (Ω)

In this measurement, the voltage of 500 V was applied to the wafer, and the resistance was measured one minute after the application of voltage, in order to obtain a stable measurement value.

The surface potential was measured as follows. The T2-processed LT wafer was heated up on a hot plate from 30° C. to 70° C. in 1 minute, and the measurement was obtained by using SFM775 manufactured by Ion Systems as the change of surface potential during the heating-up. The electric conductivity and the surface potential thus obtained are shown in Table 1. In all the following Tables, description such as "9.3E−14" in electric conductivity, means "9.3×10⁻14." As a result, in every case of examples 1-18, the electric conductivity was high and the surface potential was low. In order to further increase the electric conductivity and to further lower the surface potential, it was preferable that the temperature of T1 was 700° C. or higher. And in every example, because T2 was Curie temperature or lower, single-polarized structure of the T2-processed LT wafer was maintained.

EXAMPLES 19-28

The LT lapped wafers were placed in a sealed furnace through which a hydrogen gas was flowed at a rate of approximately 1.5 liters per minute. The wafer was maintained at the temperature of T1 shown in Table 2 for 1 hour, and a T1-processed LT wafer was obtained. Then, the single-polarized LT lapped wafer and the T1-processed LT wafer were piled alternately to be contacted with each other, and placed in a sealed furnace through which a reducing gas shown in Table 2 was flowed at a rate of approximately 1.5 liters per minute. After the furnace was maintained at the temperature of T2 shown in Table 2 for 1 hour, the furnace was cooled down at a rate of about 6.7° C. per minute. An atmosphere was introduced into the furnace when the temperature reached 250° C. or less, and the wafer was removed from the furnace when the temperature reached 30° C. or less. Thereby, a T2-processed LT wafer was obtained. The electric conductivity and surface potential measured according to the same method as set forth was shown in Table 2. As a result, in every case of examples 19-28, the electric conductivity was high and the surface potential was low. In order to further increase the electric conductivity and to further lower the surface potential, it was preferable that the temperature of T2 was 400° C. or higher. And in every example, because T2 was Curie temperature or lower, single-polarized structure of the T2-processed LT wafer was maintained.

Comparative Examples 1-4

The electric conductivity and surface potential of the LT lapped wafers that were never subjected to reduction treatment is shown in Table 3. The electric conductivity was low and the surface potential was high.

The LT lapped wafers were placed in a sealed furnace through which a hydrogen gas was flowed at a rate of approximately 1.5 liters per minute. After the wafer was maintained at the temperature of 600° C. that is not more than Curie temperature for the time shown in Table 3, the furnace was cooled down at a rate of about 6.7° C. per minute. When the temperature reached 30° C. or less, an atmosphere was introduced into the furnace and the wafer was removed from the furnace. Thereby, a reduced LT wafer was obtained. The electric conductivity and surface potential measured according to the same method as set forth was shown in Table 3. Even when any heat treatment time was used, both the electric conductivity and the surface potential were nearly equal values to those of the LT wafer that was not reduced. In addition, color change of the wafer was not observed by visual inspection.

EXAMPLES 29-31

The LT lapped wafers were placed in a sealed furnace through which a hydrogen gas was flowed at a rate of approximately 1.5 liters per minute. The wafer was maintained at 1000° C. for 10 hours, thereby the T1-processed LT wafer was obtained. Then, the LT wafer and the T1-processed LT wafer were piled alternately to be contacted with each other, and the wafer was placed in a sealed furnace through which a hydrogen gas was flowed at a rate of approximately 1.5 liters per minute. After the furnace was maintained at 550° C. for 6 hours, the furnace was cooled down at a rate of about 6.7° C. per minute. An atmosphere was introduced into the furnace when the temperature reached 250° C. or less, and the wafer was removed from the furnace when the temperature reached 30° C. or less. Thereby, three slices of T2-processed LT wafers were obtained. Next, two slices of wafers among the T2-processed LT wafers were placed in a furnace in which an atmosphere was introduced, the furnace was maintained at 550° C. for 6 hours and T3-processed LT wafers were obtained. Then, one slice of the T3-processed LT wafers and another T1-processed LT wafer were piled alternately to be contacted with each other, and placed in a sealed furnace through which a hydrogen gas was flowed at a rate of approximately 1.5 liters per minute. After the furnace was maintained at 550° C. for 6 hours, the furnace was cooled down at a rate of about 6.7° C. per minute. An atmosphere was introduced into the furnace when the temperature reached 250° C. or less, and the wafer was removed from the furnace when the temperature reached 30° C. or less. Thereby, a T2''-processed LT wafer was obtained. Then, another slice of the T3-processed LT wafers was placed in a sealed furnace through which a hydrogen gas was flowed at a rate of approximately 1.5 liters per minute. After the furnace was maintained at 550° C. for 6 hours, the furnace was cooled down at a rate of about 6.7° C. per minute. An atmosphere was introduced into the furnace when the temperature reached 250° C. or less, and the wafer was removed from the furnace when the temperature reached 30° C. or less. Thereby, a T2'''-processed LT wafer was obtained. The electric conductivity and surface potential of the T2-processed LT wafer, the T2''-processed LT wafer and the T2'''-processed LT wafer measured according to the same method as set forth were shown in Table 4. As a result, in examples 30 and 31, the electric conductivity was higher and the surface potential was lower than those in example 29.

The present invention is not limited to the above-described embodiments. The above-described embodiments is mere examples, and those having the substantially same structure as that described in the appended claims and providing the similar action and effects are included in the scope of the present invention.

TABLE 1

| | T1 reducing atmosphere | Temperature T1 (° C.) | Temperature T2 (° C.) | Electric Conductivity ($\Omega^{-1}cm^{-1}$) | Surface Potential (kV) |
|---|---|---|---|---|---|
| Example 1 | 100% $H_2$ | 1100 | 600 | 9.3E−12 | <0.1 |
| Example 2 | 100% $H_2$ | 1000 | 600 | 7.7E−12 | <0.1 |
| Example 3 | 100% $H_2$ | 900 | 600 | 6.2E−12 | <0.1 |
| Example 4 | 100% $H_2$ | 800 | 600 | 4.8E−12 | <0.1 |
| Example 5 | 100% $H_2$ | 700 | 600 | 3.2E−12 | <0.1 |
| Example 6 | 100% $H_2$ | 650 | 600 | 1.4E−13 | 1.3 |
| Example 7 | 100% CO | 700 | 600 | 3.6E−12 | <0.1 |
| Example 8 | 90% $H_2$—10% $N_2$ | 700 | 600 | 1.8E−12 | <0.1 |
| Example 9 | 10% $H_2$—90% $N_2$ | 700 | 600 | 1.2E−12 | <0.1 |
| Example 10 | 10% $H_2$—90% He | 700 | 600 | 2.9E−12 | <0.1 |
| Example 11 | 10% $H_2$—90% Ne | 700 | 600 | 2.2E−12 | <0.1 |
| Example 12 | 10% $H_2$—90% Ar | 700 | 600 | 3.1E−12 | <0.1 |
| Example 13 | 100% $H_2$ | 1100 | 500 | 6.8E−12 | <0.1 |
| Example 14 | 100% $H_2$ | 1100 | 400 | 2.6E−12 | <0.1 |
| Example 15 | 100% $H_2$ | 1100 | 350 | 1.5E−13 | 1.2 |
| Example 16 | 100% CO | 1100 | 500 | 6.7E−12 | <0.1 |
| Example 17 | 100% CO | | 400 | 3.5E−12 | <0.1 |
| Example 18 | 100% CO | 1100 | 350 | 2.0E−13 | 0.9 |

TABLE 2

| | T2 reducing atmosphere | Temperature T1 (° C.) | Temperature T2 (° C.) | Electric Conductivity ($\Omega^{-1}cm^{-1}$) | Surface Potential (kV) |
|---|---|---|---|---|---|
| Example 19 | 100% CO | 1100 | 600 | 8.8E−12 | <0.1 |
| Example 20 | 100% CO | 1100 | 500 | 6.0E−12 | <0.1 |
| Example 21 | 100% CO | 1100 | 400 | 2.9E−12 | <0.1 |
| Example 22 | 100% CO | 1100 | 350 | 1.6E−13 | 1.4 |
| Example 23 | 100% CO | 700 | 600 | 2.8E−12 | <0.1 |
| Example 24 | 90% $H_2$—10% $N_2$ | 700 | 600 | 1.9E−12 | <0.1 |
| Example 25 | 10% $H_2$—90% $N_2$ | 700 | 600 | 1.1E−12 | <0.1 |
| Example 26 | 10% $H_2$—90% He | 700 | 600 | 3.2E−12 | <0.1 |
| Example 27 | 10% $H_2$—90% Ne | 700 | 600 | 2.3E−12 | <0.1 |
| Example 28 | 10% $H_2$—90% Ar | 700 | 600 | 2.3E−12 | <0.1 |

TABLE 3

| | Temperature T1 (° C.) | Time (hr) | Electric Conductivity ($\Omega^{-1}cm^{-1}$) | Surface Potential (kV) |
|---|---|---|---|---|
| Comparative Example 1 | without reduction treatment | — | 3.0E−15 | 6.7 |
| Comparative Example 2 | 600 | 1 | 6.8E−15 | 6.5 |

TABLE 3-continued

| | Temperature T1 (° C.) | Time (hr) | Electric Conductivity ($\Omega^{-1}cm^{-1}$) | Surface Potential (kV) |
|---|---|---|---|---|
| Comparative Example 3 | 600 | 10 | 7.7E−15 | 6.5 |
| Comparative Example 4 | 600 | 20 | 8.5E−15 | 6.4 |

TABLE 4

| | Wafer | Electric Conductivity ($\Omega^{-1}cm^{-1}$) | Surface Potential (kV) |
|---|---|---|---|
| Example 29 | T2'-processed LT wafer | 8.5E−12 | <0.1 |
| Example 30 | T2''-processed LT wafer | 1.5E−11 | <0.1 |
| Example 31 | T2'''-processed LT wafer | 1.4E−11 | <0.1 |

What is claimed is:

1. A method of producing a lithium-tantalate crystal with increased electric conductivity, wherein a substance reduced at a temperature of T1 is contacted with a lithium-tantalate crystal at a temperature of T2 that is lower than the temperature of T1 in a reducing atmosphere.

2. The method of producing a lithium-tantalate crystal according to claim 1, wherein the temperature of T1 is 7000° C. or higher.

3. The method of producing a lithium-tantalate crystal according to claim 2, wherein any one of a crystal, a ceramic and a metal is used as the substance reduced at the temperature of T1.

4. The method of producing a lithium-tantalate crystal according to claim 3, wherein a lithium tantalate or a lithium niobate is used as the crystal or the ceramic.

5. The method of producing a lithium-tantalate crystal according to claim 4, wherein a single-polarized crystal is used as the lithium-tantalate crystal contacted at the temperature of T2 with the substance reduced at the temperature of T1.

6. The method of producing a lithium-tantalate crystal according to claim 3, wherein a single-polarized crystal is used as the lithium-tantalate crystal contacted at the temperature of T2 with the substance reduced at the temperature of T1.

7. The method of producing a lithium-tantalate crystal according to claim 2, wherein a single-polarized crystal is used as the lithium-tantalate crystal contacted at the temperature of T2 with the substance reduced at the temperature of T1.

8. The method of producing a lithium-tantalate crystal according to claim 1, wherein the reduction at the temperature of T1 is performed in a reducing gas containing any one of hydrogen, carbon monoxide and nitrous oxide, or a mixed gas consisting of two or more of them.

9. The method of producing a lithium-tantalate crystal according to claim 8, wherein the reduction is performed in an atmosphere in which any one of He, Ne, Ar, other rare gases, nitrogen, and carbon dioxide, or a mixed gas consisting of two or more of them is added further to the reducing gas.

10. The method of producing a lithium-tantalate crystal according to claim 9, wherein any one of a crystal, a ceramic and a metal is used as the substance reduced at the temperature of T1.

11. The method of producing a lithium-tantalate crystal according to claim 10, wherein a lithium tantalate or a lithium niobate is used as the crystal or the ceramic.

12. The method of producing a lithium-tantalate crystal according to claim 11, wherein a single-polarized crystal is used as the lithium-tantalate crystal contacted at the temperature of T2 with the substance reduced at the temperature of T1.

13. The method of producing a lithium-tantalate crystal according to claim 10, wherein a single-polarized crystal is used as the lithium-tantalate crystal contacted at the temperature of T2 with the substance reduced at the temperature of T1.

14. The method of producing a lithium-tantalate crystal according to claim 9, wherein a single-polarized crystal is used as the lithium-tantalate crystal contacted at the temperature of T2 with the substance reduced at the temperature of T1.

15. The method of producing a lithium-tantalate crystal according to claim 8, wherein any one of a crystal, a ceramic and a metal is used as the substance reduced at the temperature of T1.

16. The method of producing a lithium-tantalate crystal according to claim 15, wherein a lithium tantalate or a lithium niobate is used as the crystal or the ceramic.

17. The method of producing a lithium-tantalate crystal according to claim 16, wherein a single-polarized crystal is used as the lithium-tantalate crystal contacted at the temperature of T2 with the substance reduced at the temperature of T1.

18. The method of producing a lithium-tantalate crystal according to claim 15 wherein a single-polarized crystal is used as the lithium-tantalate crystal contacted at the temperature of T2 with the substance reduced at the temperature of T1.

19. The method of producing a lithium-tantalate crystal according to claim 8, wherein a single-polarized crystal is used as the lithium-tantalate crystal contacted at the temperature of T2 with the substance reduced at the temperature of T1.

20. The method of producing a lithium-tantalate crystal according to claim 1, wherein any one of a crystal, a ceramic and a metal is used as the substance reduced at the temperature of T1.

21. The method of producing a lithium-tantalate crystal according to claim 20, wherein the crystal or the ceramic which consists of mixed oxide with nonstoichiometric composition is used.

22. The method of producing a lithium-tantalate crystal according to claim 21, wherein a lithium tantalate or a lithium niobate is used as the crystal or the ceramic.

23. The method of producing a lithium-tantalate crystal according to claim 22, wherein a single-polarized crystal is used as the lithium-tantalate crystal contacted at the temperature of T2 with the substance reduced at the temperature of T1.

24. The method of producing a lithium-tantalate crystal according to claim 21, wherein a single-polarized crystal is used as the lithium-tantalate crystal contacted at the temperature of T2 with the substance reduced at the temperature of T1.

25. The method of producing a lithium-tantalate crystal according to claim 20, wherein a lithium tantalate or a lithium niobate is used as the crystal or the ceramic.

26. The method of producing a lithium-tantalate crystal according to claim 25, wherein a single-polarized crystal is used as the lithium-tantalate crystal contacted at the temperature of T2 with the substance reduced at the temperature of T1.

27. The method of producing a lithium-tantalate crystal according to claim 20, wherein a hydrogen storage alloy is used as the metal.

28. The method of producing a lithium-tantalate crystal according to claim 27, wherein a single-polarized crystal is used as the lithium-tantalate crystal contacted at the temperature of T2 with the substance reduced at the temperature of T1.

29. The method of producing a lithium-tantalate crystal according to claim 20, wherein a single-polarized crystal is used as the lithium-tantalate crystal contacted at the temperature of T2 with the substance reduced at the temperature of T1.

30. The method of producing a lithium-tantalate crystal according to claim 1, wherein a single-polarized crystal is used as the lithium-tantalate crystal contacted at the temperature of T2 with the substance reduced at the temperature of T1.

31. The method of producing a lithium-tantalate crystal according to claim 30, wherein a crystal that is in a step before slicing is used as the single-polarized crystal.

32. The method of producing a lithium-tantalate crystal according to claim 30, wherein a wafer subjected to a slicing process or a wafer subjected to a lapping process is used as the single-polarized crystal.

33. The method of producing a lithium-tantalate crystal according to claim 1, wherein the temperature of T2 is 400° C.-600° C.

34. The method of producing a lithium-tantalate crystal according to claim 33, wherein after the process at the temperature of T2, an atmosphere is introduced at a temperature of 250° C. or less.

35. The method of producing a lithium-tantalate crystal according to claim 1, wherein the reduction at the temperature of T2 is performed in a reducing gas consisting of any one of hydrogen, carbon monoxide and nitrous oxide, or a mixed gas consisting of them.

36. The method of producing a lithium-tantalate crystal according to claim 35, wherein the reduction is performed in an atmosphere in which an inert gas consisting of He, Ne, Ar, other rare gases, nitrogen, and carbon dioxide, or a mixed gas consisting of them is added further to the reducing gas.

37. A method of producing a lithium-tantalate crystal, wherein at least a first material containing lithium tantalate, lithium niobate or hydrogen storage alloy storing hydrogen that is subjected to a heat treatment at a temperature of T1' that is Curie temperature or higher in a reducing atmosphere is superposed on a single-polarized lithium-tantalate crystal, and then the crystal is subjected to a heat treatment at a temperature of T2' that is lower than Curie temperature in a reducing atmosphere, thereby an electric conductivity of the single-polarized lithium-tantalate crystal is increased.

38. A method of producing a lithium-tantalate crystal, wherein the lithium-tantalate crystal obtained by the method according to claim 37 is subjected to a heat treatment at a temperature of T3 that is lower than Curie temperature in an atmosphere, the lithium-tantalate crystal is subjected to a heat treatment at a temperature of T2''' that is lower than Curie temperature in a reducing atmosphere, thereby an electric conductivity of the lithium-tantalate crystal is increased.

39. The method of producing a lithium-tantalate crystal according to claim 38, wherein a ceramic or a crystal consisting of lithium tantalate or lithium niobate is used as the first material.

40. The method of producing a lithium-tantalate crystal according to claim 37, wherein the temperatures of T2' that is lower than Curie temperature are 400° C. or higher.

41. The method of producing a lithium-tantalate crystal according to claim 40, wherein a ceramic or a crystal consisting of lithium tantalate or lithium niobate is used as the first material.

42. The method of producing a lithium-tantalate crystal according to claim 37, wherein a wafer subjected to a slicing process or a wafer subjected to a lapping process is used as the single-polarized lithium-tantalate crystal.

43. The method of producing a lithium-tantalate crystal according to claim 42, wherein a ceramic or a crystal consisting of lithium tantalate or lithium niobate is used as the first material.

44. The method of producing a lithium-tantalate crystal according to claim 37, wherein a ceramic or a crystal consisting of lithium tantalate or lithium niobate is used as the first material.

45. The method of producing a lithium-tantalate crystal according to claim 44, wherein a composition that doesn't have a composition ratio according to stoichiometry is used as the ceramic or the crystal consisting of lithium tantalate or lithium niobate.

46. The method of producing a lithium-tantalate crystal according to claim 44, wherein a wafer subjected to a slicing process that is obtained from a crystal consisting of lithium tantalate or lithium niobate or a wafer subjected to a lapping process that is obtained from a crystal consisting of lithium tantalate or lithium niobate is used as the first material.

47. The method of producing a lithium-tantalate crystal according to claim 37, wherein after the heat treatment at the temperature of T2', the lithium-tantalate crystal is exposed to an atmosphere at a temperature of 250° C. or less.

48. The method of producing a lithium-tantalate crystal according to claim 37, wherein the reducing atmosphere for the heat treatment at the temperature of T1' and T2' contains a reducing gas consisting of at least any one of hydrogen, carbon monoxide and nitrous oxide.

49. The method of producing a lithium-tantalate crystal according to claim 48, wherein an additional gas consisting of at least any one of rare gases, nitrogen, and carbon dioxide is added further to the reducing gas.

50. A method of producing a lithium-tantalate crystal, wherein the lithium-tantalate crystal obtained by the method according to claim 37 is subjected to a heat treatment at a temperature of T3 that is lower than Curie temperature in an atmosphere, the lithium-tantalate crystal is superposed on a second material containing lithium tantalate, lithium niobate or hydrogen storage alloy storing hydrogen that is subjected to a heat treatment at a temperature of T1" that is Curie temperature or higher in a reducing atmosphere, and the crystal is subjected to a heat treatment at a temperature of T2" that is lower than Curie temperature in a reducing atmosphere, thereby an electric conductivity of the lithium-tantalate crystal is increased.

51. The method of producing a lithium-tantalate crystal according to claim 50, wherein a ceramic or a crystal consisting of lithium tantalate or lithium niobate is used as the first material or the second material.

* * * * *